United States Patent
Hung et al.

(10) Patent No.: US 7,574,639 B2
(45) Date of Patent: Aug. 11, 2009

(54) METHOD AND APPARATUS FOR ENTERING SPECIAL MODE IN INTEGRATED CIRCUIT

(75) Inventors: Ching-Ho Hung, Hsinchu (TW); Shih-Pin Hsu, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 352 days.

(21) Appl. No.: 11/530,482

(22) Filed: Sep. 11, 2006

(65) Prior Publication Data
US 2007/0283199 A1 Dec. 6, 2007

(30) Foreign Application Priority Data
May 12, 2005 (TW) .............................. 95116889 A

(51) Int. Cl.
*G01R 31/28* (2006.01)
*G06F 11/00* (2006.01)
(52) U.S. Cl. ........................................ 714/724; 714/27
(58) Field of Classification Search ................. 714/724, 714/727
See application file for complete search history.

(56) References Cited

U.S. PATENT DOCUMENTS

| 5,259,006 | A | * | 11/1993 | Price et al. | .................. | 375/356 |
| 5,826,007 | A | * | 10/1998 | Sakaki et al. | ................. | 714/42 |
| 6,874,069 | B2 | * | 3/2005 | Lin et al. | ..................... | 711/156 |
| 7,058,756 | B2 | * | 6/2006 | Park | .......................... | 711/105 |

\* cited by examiner

*Primary Examiner*—James C Kerveros
(74) *Attorney, Agent, or Firm*—Jianq Chyun IP Office

(57) ABSTRACT

A method and an apparatus for entering special mode in integrated circuit (IC) or logic circuit are provided. The IC or logic circuit receives a plurality of data bits and a reset signal, wherein the reset signal is used to reset the IC or the logic circuit. The apparatus includes a plurality of registers and a logic circuit. The registers receive the data bits and the reset signal and output the data bits when the reset signal is transferred from a second state to a first state. The logic circuit includes a logic output terminal and a plurality of logic input terminals, wherein the logic input terminals are coupled to the registers respectively and receiving the data bits output from the registers. When the logic input terminals receive a predetermined value, the logic value output from the logic output terminal is transferred to enter the special mode.

21 Claims, 13 Drawing Sheets

METHOD AND APPARATUS FOR ENTERING SPECIAL MODE IN INTEGRATED CIRCUIT

CROSS-REFERENCE TO RELATED APPLICATION

This application claims the priority benefit of Taiwan application serial no. 95116889, filed May 12, 2006. All disclosure of the Taiwan application is incorporated herein by reference.

BACKGROUND OF THE INVENTION

1. Field of Invention

The present invention relates to a method and an apparatus for entering a special mode in an integrated circuit (IC) or a logic circuit. More particularly, the present invention relates to a method and an apparatus for entering a special mode in an IC or a logic circuit after being reset.

2. Description of Related Art

Generally speaking, products such as displays and ICs must go through a shop test after being fabricated, so a special mode known as "engineering mode" must be designed. The "engineering mode" can be used to determine whether the products such as ICs or displays can work well or not, or to set the factory settings of the products. Under the consideration of protecting the normal operation of the products with the settings not being modified by clients or users, the special mode such as "engineering mode" is not commonly known.

FIG. 1 is a block view of a conventional apparatus for entering the special mode in the IC. One IC component is taken as an example for illustration herein. The IC component comprises original pins 100 and a special mode detecting pin 101. When it is intended to enter the special mode such as the "engineering mode", the special mode detecting pin 101 is set to a logic high level or a logic low level, thus entering the special mode. However, a system factory usually does not use the special mode detecting pin 101 when purchasing IC components, and this additional pin which is not actually used by the system clients cause a burden for the system factories. Taking the using of a logic high level to enter the special mode as an example, system factories, when using the above IC components, must connect this special pin to ground. Thus, it's really inconvenience for the system factories to design the layout of the IC components on the circuit board. Most clients prefer to choose another IC with the same function but without the pins, which may cause loss of customers.

Directed to the above disadvantages of the conventional art as shown in FIG. 1, a solution is provided. FIG. 2 is a circuit diagram of another conventional apparatus for entering the special mode in the IC. Similarly, the IC circuit is taken as an example for illustration, in which the apparatus comprises a plurality of registers 200 and a logic circuit 201. The apparatus employs a plurality of original data bits data_1~data_N of the IC to be set to a certain predetermined value through a program. After the setting value is stored in the registers 200, a logic circuit 201 is used to determine the IC to enter the special mode or not. However, this method may be wrongly used by clients. If the clients carelessly change the register to be the predetermined value, they may enter the special mode, thus causing an unsuspected function or an abnormal function of the IC.

SUMMARY OF THE INVENTION

The objective of the present invention is to provide a method and an apparatus for entering a special mode in an IC or in a liquid crystal display module. It will enter the special mode after the IC or the liquid crystal display module is reset, so as to prevent the clients from entering the special mode by mistake which may cause the abnormal function of the IC or liquid crystal display module. It enters the special mode without using additional pins of the IC or the liquid crystal display module.

The present invention provides an apparatus for entering the special mode in the IC. The IC receives a plurality of data bits and a reset signal, wherein the reset signal is used to reset IC. The apparatus comprises a plurality of registers and a logic circuit. The plurality of registers receives the plurality of data bits and the reset signal. When the reset signal is transferred from a second state to a first state, the registers store the data and output the data. The logic circuit comprises a logic output terminal and a plurality of logic input terminals being respectively coupled to the plurality of registers for receiving the data bits output from the plurality of registers. When the logic input terminals receive a predetermined value, the logic value output by the logic output terminal is transferred to enter the special mode.

The present invention provides an apparatus for entering the special mode in the IC. The IC receives a plurality of data bits and a reset signal, wherein the reset signal is used to reset IC. The apparatus comprises a first logic circuit, a delay circuit, and a first register. The first logic circuit comprises a first logic output terminal and a plurality of the first logic input terminals for receiving the data bits. When the first logic input terminals receive a predetermined value, the logic state of the first logic output terminal is transferred. The delay circuit is used to receive the reset signal and delay the reset signal for a predetermined period of time and then output it as a delayed reset signal. The first register comprises a first clock input terminal for receiving the delayed reset signal, a first register input terminal for receiving the logic value of the first logic output terminal, a first register output terminal, and a first reset terminal for receiving the reset signal. When the delayed reset signal is transferred from a second state to a first state, the first register output terminal outputs the logic value received by the first register input terminal, wherein whether or not to enter the special mode is determined according to the logic value.

According to the descriptions of last section, a preferred embodiment of the apparatus for entering the special mode in the IC of the present invention further comprises a second register and a second logic circuit. The second register comprises a second clock input terminal for receiving a clock signal, a second register input terminal for receiving an input data, a second register output terminal, and a second reset terminal for receiving the reset signal. The second logic circuit comprises a second logic output terminal and a plurality of the second logic input terminals being respectively coupled to the second register output terminal and the first register output terminal. After performing a logic operation on the output logic of the second register output terminal and the first register output terminal, a logic decision value is output. When the logic decision value is a logic predetermined value, enter the special mode.

The present invention provides a method for entering the special mode in the IC or the liquid crystal display module, which comprises first receiving a plurality of the data bits. During the resetting of the IC or the liquid crystal display module, the data bits are determined to be a predetermined value or not. If "yes", enter the special mode.

The present invention provides a method for entering the special mode in the IC or the liquid crystal display module, which comprises first setting a plurality of the data bits to be a first predetermined value. When a reset signal is enabled, the first data bits are stored. After the reset signal is ended, a second predetermined value is input. When the first predetermined value and the second predetermined value are received, a predetermined logic value is output for entering the special mode.

In the present invention, during the resetting of the IC or the liquid crystal display module, the original data line is set to be a special data value, thus accomplishing entering the special mode without using additional pins of the IC or the liquid crystal display module, and also preventing the clients from carelessly entering the special mode which may cause the abnormal function of the IC or the liquid crystal display module.

In order to make aforementioned and other objects, features and advantages of the present invention comprehensible, preferred embodiments accompanied with figures are described in detail below.

DESCRIPTION OF EMBODIMENTS

Directed to the defects of the conventional method for entering the special mode, the present invention provides a method and an apparatus for entering the special mode in the IC, which are to solve the conventional problem that additional pins are required to enter the special mode, and also to solve another conventional problem that the clients may carelessly enter the special mode thus causing an unsuspected function or some functional error. The apparatus and the method of the embodiments will be illustrated hereinafter with reference to the accompanying drawings.

Figure 1:
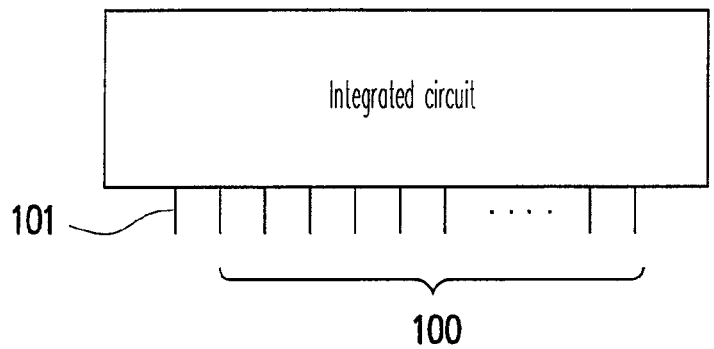
FIG. 1 is a block view of a conventional apparatus for entering the special mode in the IC.
Figure 2:
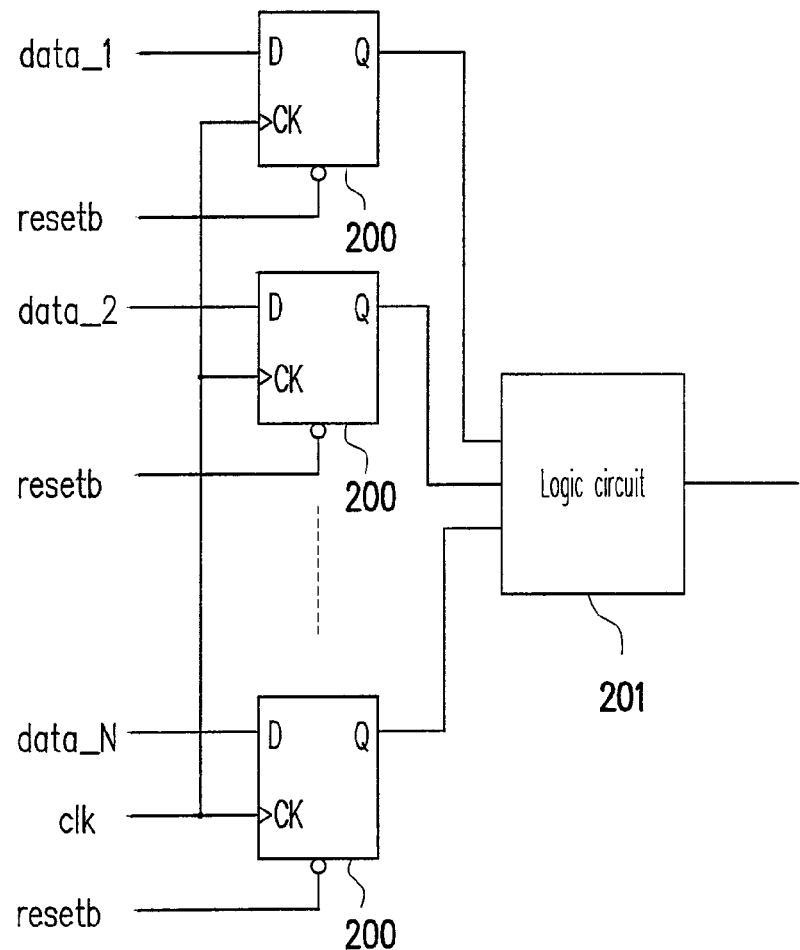
FIG. 2 is a circuit diagram of another conventional apparatus for entering the special mode in the IC.
Figure 3A:
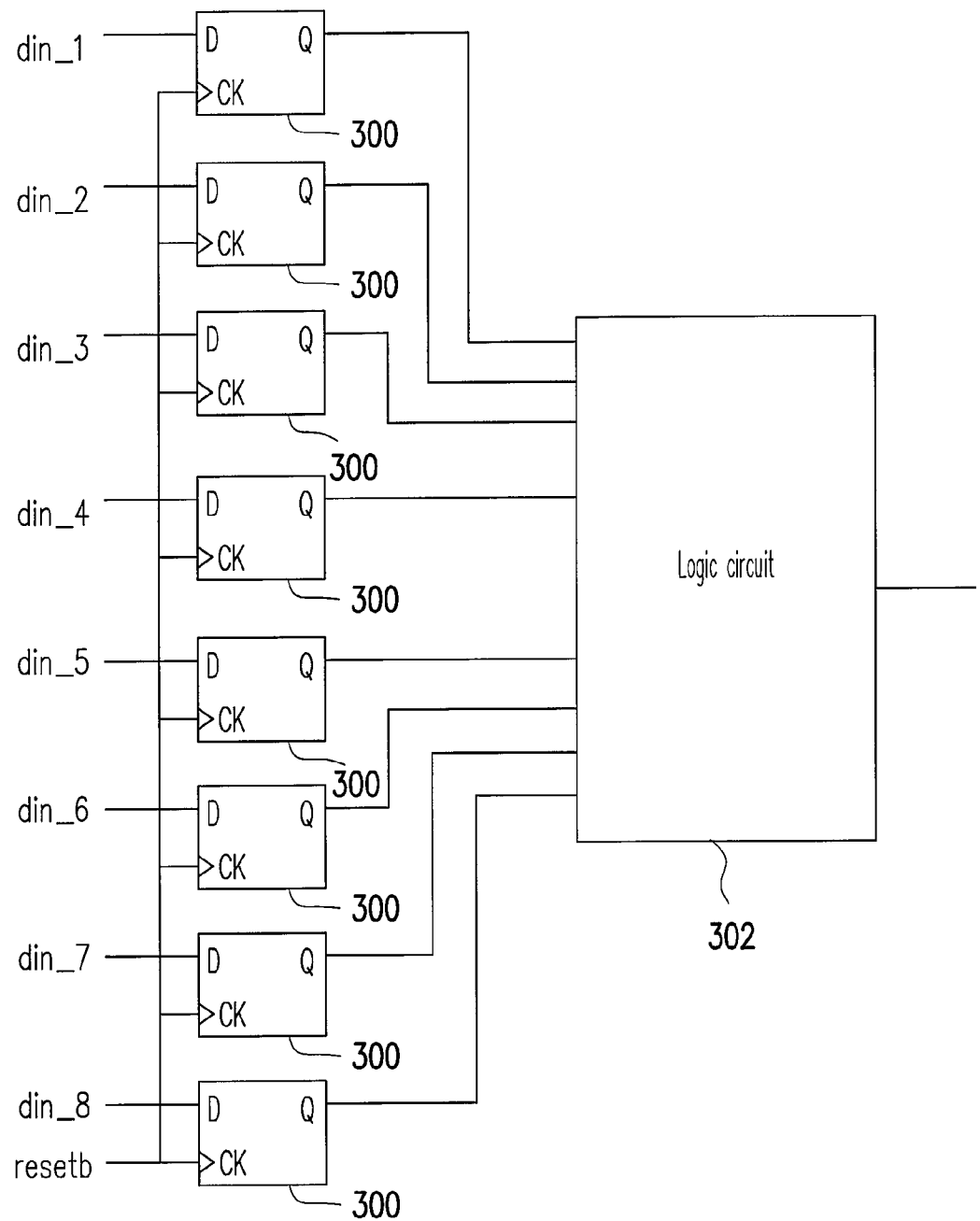
FIGS. 3A and 3B are respectively a circuit diagram of an apparatus for entering the special mode in the IC according to an embodiment of the present invention.

FIG. 3A is the circuit diagram of the apparatus for entering the special mode in the IC according to an embodiment of the present invention. Referring to FIG. 3A, the circuit comprises eight registers 300 and a logic circuit 302, wherein the registers 300 of the embodiment is a D-type flip-flop. The D input terminals (the terminals indicated by D in the figure) of the D-type flip-flops 300 respectively receive the original data bits din_1 din_2 . . . din_8 in the IC, while the D output terminals of the D-type flip-flops are coupled to the logic input terminals of the logic circuit 302. Different from the conventional art, the clock input terminal of each of the registers 300 (i.e. the D-type flip-flop in the present embodiment) receives the reset signal resetb to reset the IC.

Herein, first it is assumed that the logic circuit 302 only has one logic output terminal; when the logic value output by the logic output terminal is logic "1", enter the special mode. Therefore, when the din_1~din_8 are designed to be a certain predetermined particular value such as 10000101(133), the output of the logic circuit 302 is logic "1", and when any other values are input into logic circuit 302, the output is logic "0".

Figure 3B:
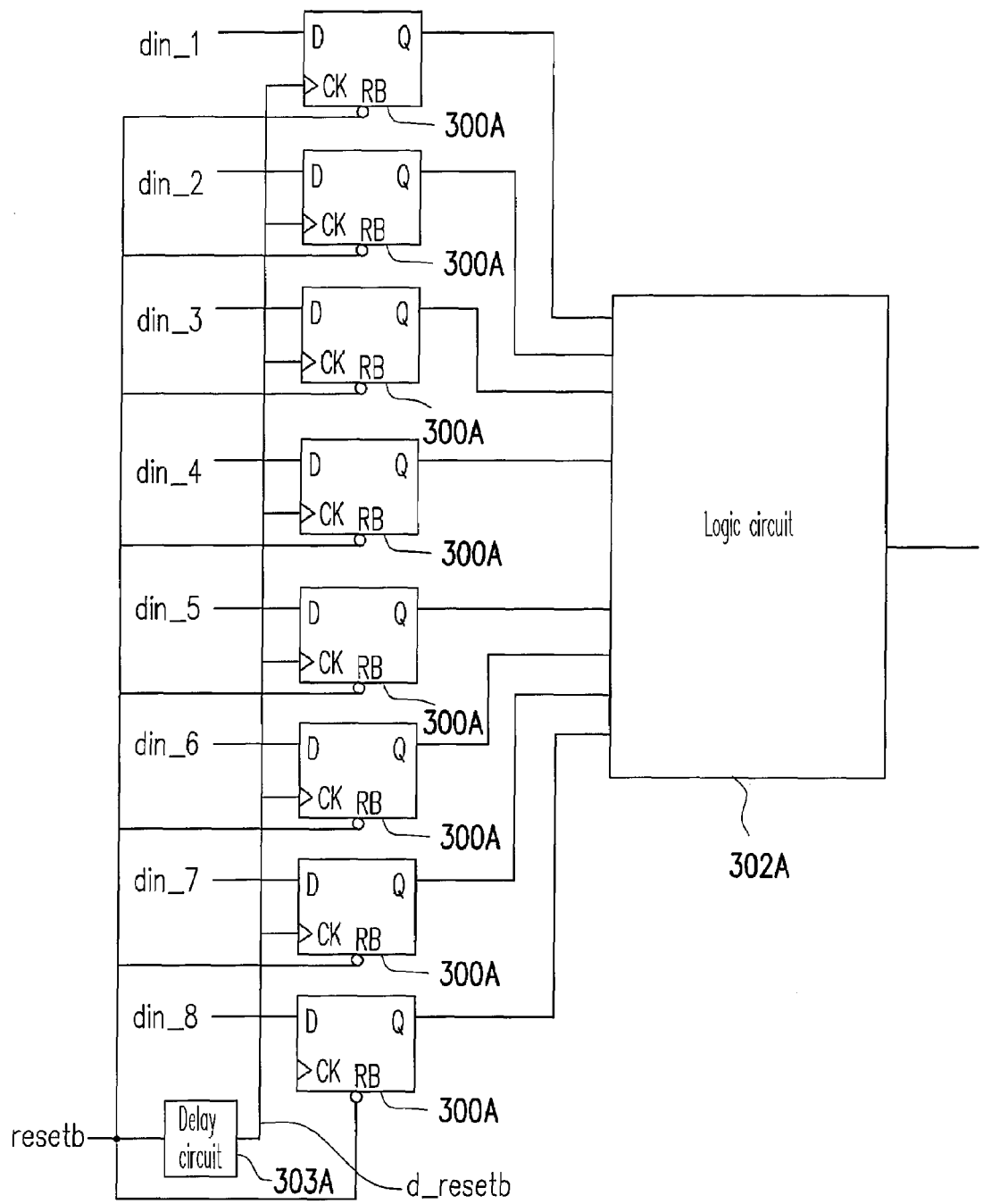

FIG. 3B is in an extension of FIG. 3A, which illustrates the circuit diagram of an apparatus for entering the special mode in the IC according to an embodiment of the present invention. Referring to FIG. 3B, the circuit employs eight registers 300A with the reset function and an additional delay circuit 303A. Different from FIG. 3A, the delay circuit 303A receives the reset signal resetb, and after delaying for a predetermined period of time such as a clock time, outputs a delayed reset signal d_resetb. The clock input terminal of each of the registers 300A (i.e. the D-type flip-flop with the reset function in the present embodiment) receives the delayed reset signal d_resetb, and the reset input terminal (RB) of each of the registers 300A is coupled to the reset signal resetb.

Thus, each of the registers 300A can be reset when the IC is reset. After the delay circuit 303A delays the resetb for a sufficient period of time, the din_1~din_8 are stored in eight registers 300A, thus improving the stability of the circuit of the apparatus for entering the special mode.

Figure 4:
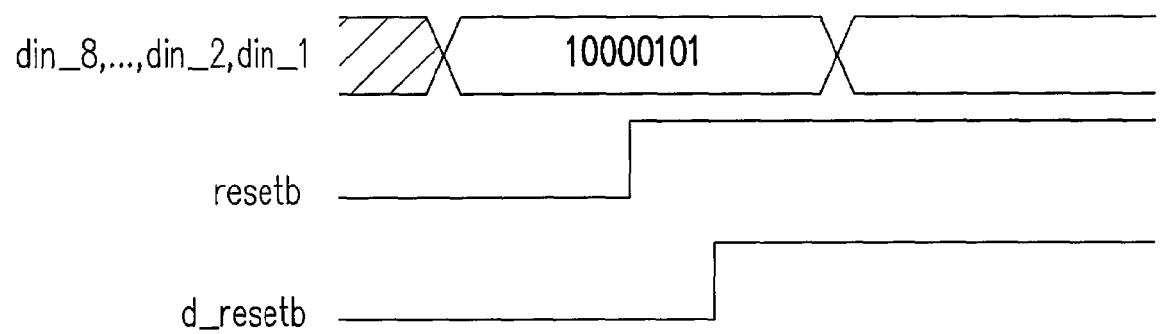
FIG. 4 is a clock waveform of an apparatus for entering the special mode in the IC according to an embodiment of FIG. 3A or 3B of the present invention.

First, the shop test of the IC before being sold is taken as an example. FIG. 4 is a clock waveform of an apparatus for entering the special mode in the IC according to an embodiment of FIG. 3A of the present invention. Referring to FIG. 3A and FIG. 4 together, when it is intended to enter the special mode, the values of din_1~din_8 must be set to be the predetermined value, 10000101(133), then the reset signal resetb is enabled. Since the reset signal resetb is supplied to the clock input terminals of the D-type flip-flops 300, when the reset signal resetb is enabled, the D-type flip-flops 300 (i.e. rising-edge trigger herein) are triggered to receive the data bits 10000101(133), such that the D-type flip-flops 300 output 10000101(133). If the output of logic "1" is obtained after the logic operation of the logic circuit, enter the special mode.

Next, the client using the IC is taken as an example. When the client carelessly sets the value of din_1~din_8 to 10000101(133) in normally operation, since the reset signal resetb is not enabled, the D-type flip-flops 300 do not receive the specified value 10000101(133). Since the value is not 133, and the output of the logic circuit 302 is logic "0", the client will not enter the special mode by mistake, and the circumstance of abnormal function of the IC will not occur.

Figure 5A:
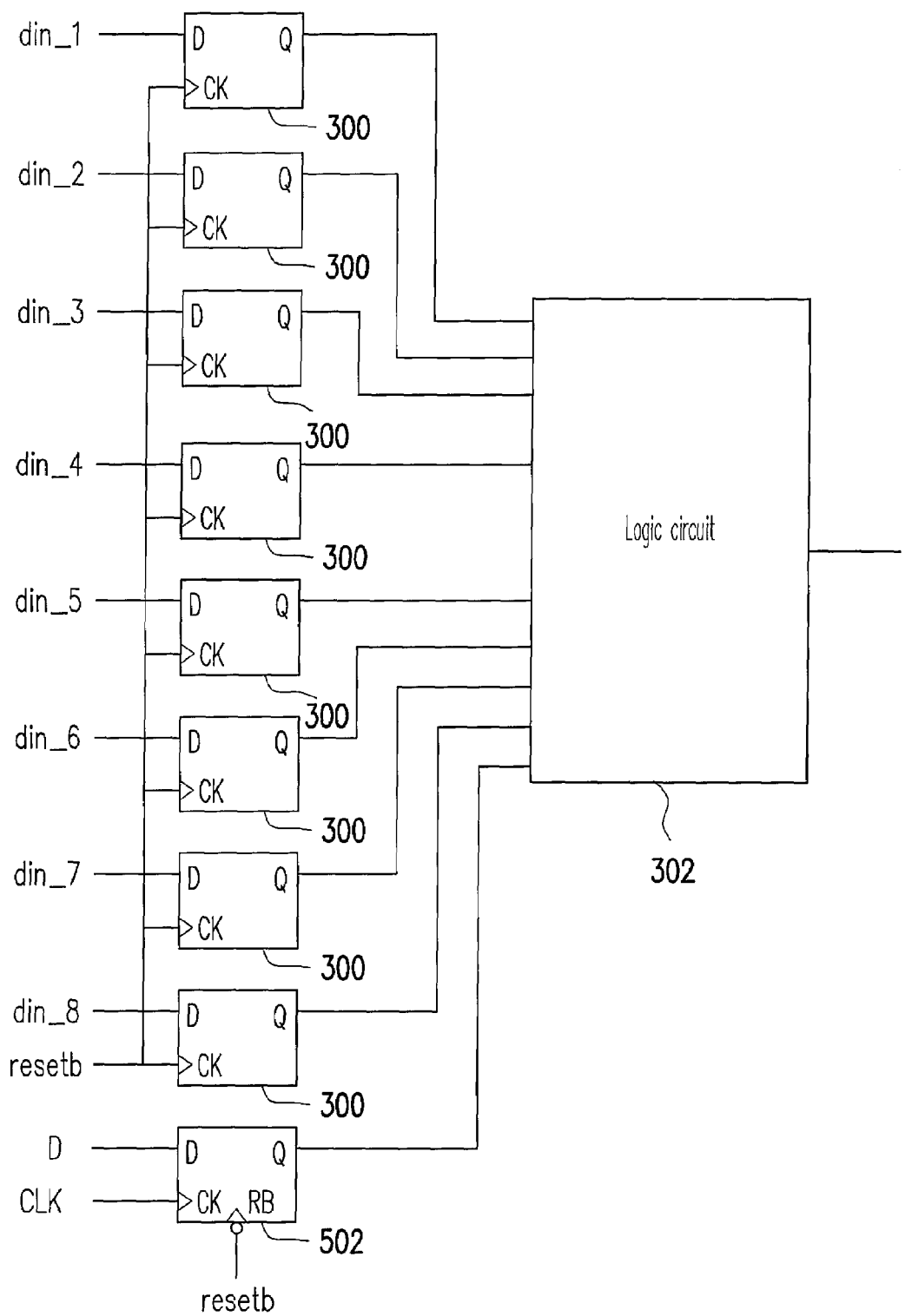
FIGS. 5A and 5B are respectively circuit diagrams of an apparatus for entering the special mode in the IC according to an embodiment of the present invention.

Without departing from the spirit of the present invention, the embodiment of FIG. 3A can also be the same as that of FIG. 5A. FIG. 5A is the circuit diagram of an apparatus for entering the special mode in the IC according to an embodiment of the present invention. In addition to the original registers 300 and the logic circuit as shown in FIG. 3A, the apparatus further comprises a set of additional registers 502. The additional registers 502 have the input terminals for receiving an input signal D, the clock input terminals for receiving a clock signal CLK, the output terminals being coupled to the logic circuit, and the reset terminals for receiving the reset signal resetb. In the embodiment, with the input method of FIG. 3, after the resetting is completed, a specified value such as logic "1" is written into the set of the registers 502 through a program, such that the registers 502 output the specified value. After receiving the logic "1" and the particular value 10000101(133), the logic circuit 302 outputs logic "1" to enter the special mode. In this manner, the problem that the client carelessly enters the special mode can be double prevented.

Figure 5B:
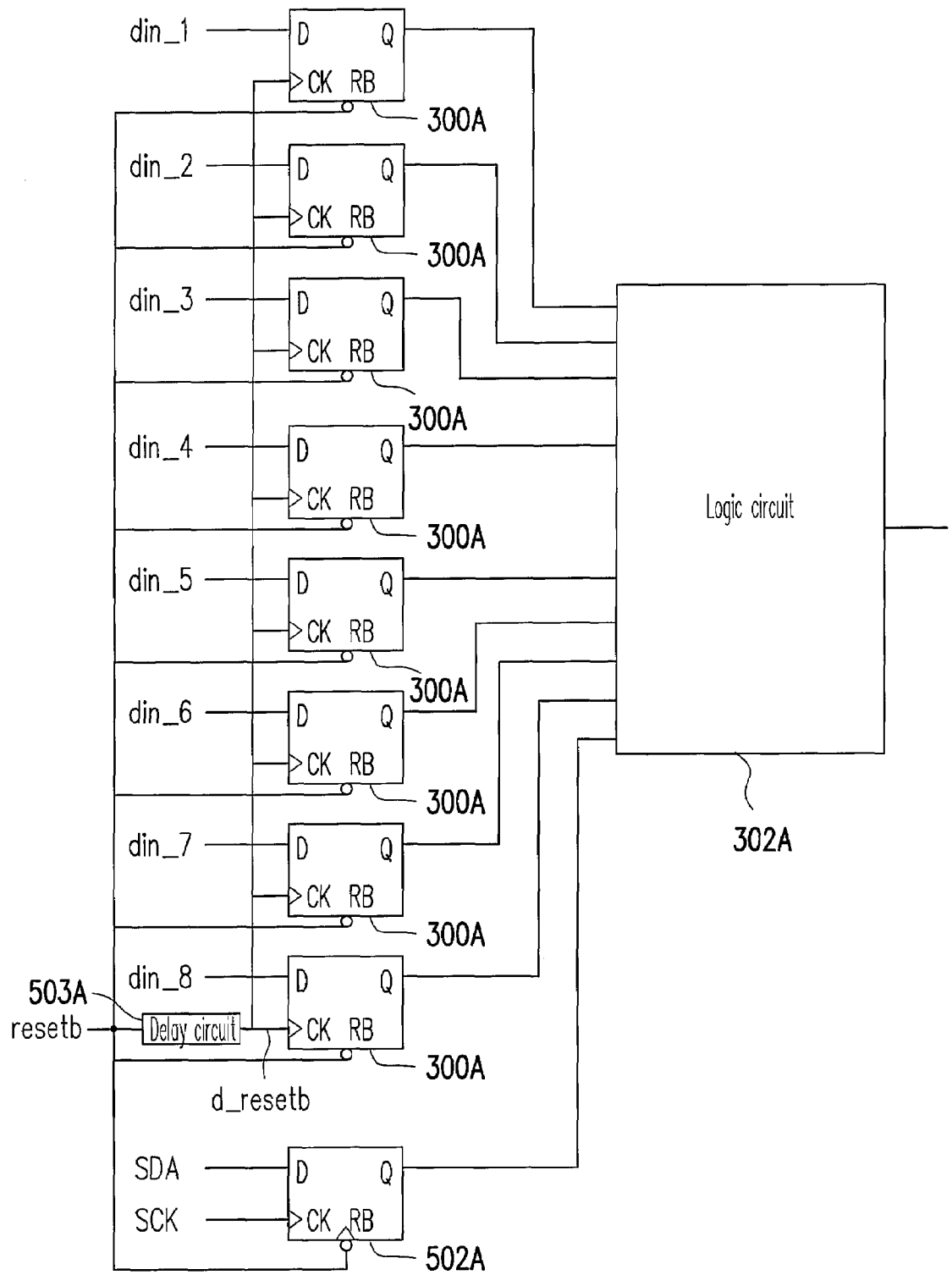

FIG. 5B is an extension of FIG. 5A, which illustrates the circuit diagram of an apparatus for entering the special mode in the IC according to an embodiment of the present invention. Referring to FIG. 5B, the circuit employs eight registers 300A with the reset function and an additional delay circuit 503A. Different from FIG. 5A, the delay circuit 503A receives the reset signal resetb, and after delaying a determined period of time such as a clock time, outputs a delayed reset signal d_resetb. The clock input terminal of each of the registers 300A (i.e. the D-type flip-flop with the reset function in the present embodiment) receives the delayed reset signal d_resetb, and the reset input terminal (RB) of each of the registers 300A is coupled to the reset signal resetb.

Thus, each of the registers 300A is reset when the IC is reset. After the delay circuit 503A delays the resetb for a sufficient period of time, the din_1~din_8 are stored in the eight registers 300A, thus improving the stability of the circuit of the apparatus for entering the special mode.

Figure 6:
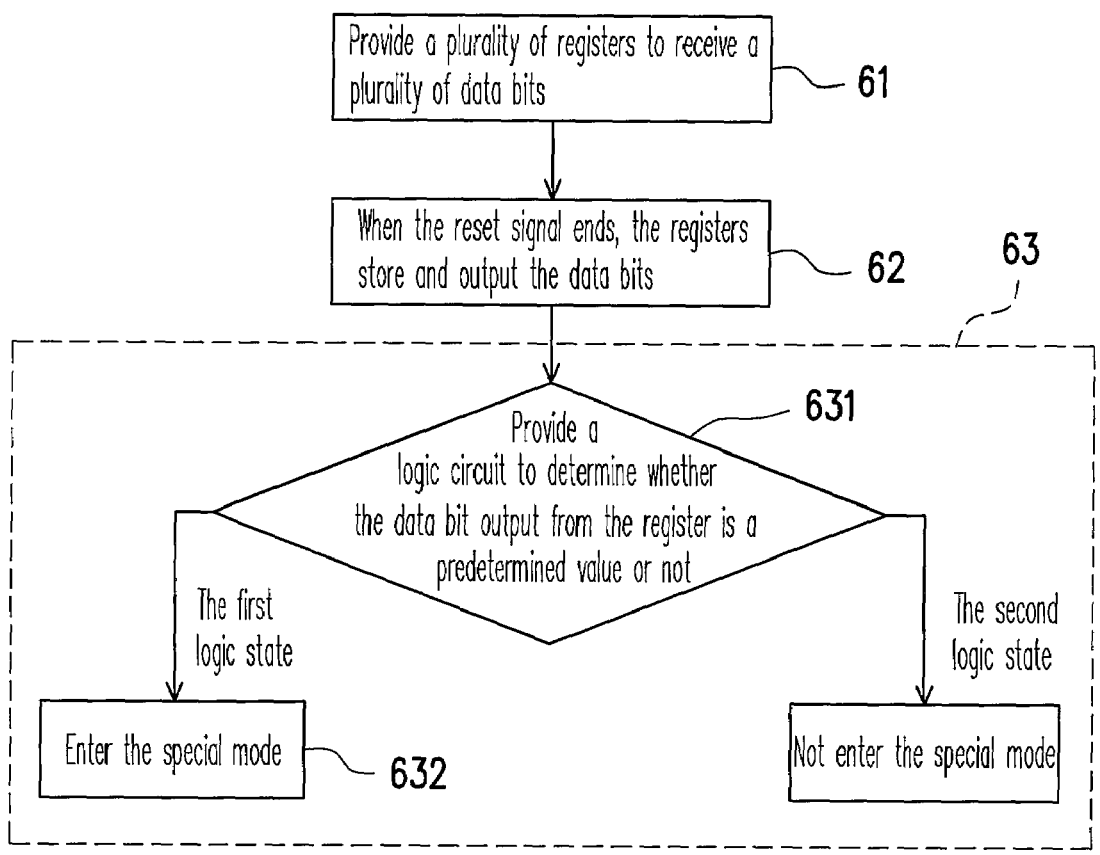
FIG. 6 is a flow chart of a method for entering the special mode in the IC according to an embodiment of the present invention.

The embodiments of FIGS. 3A and 3B can be classified into one method for entering the special mode in the IC, and the flow chart thereof is shown in FIG. 6. First, a plurality of registers 300 (or 300A) are provided to receive a plurality of data bits din_1~din_8 (step 61). When the reset signal resetb is enabled, the registers 300 (or 300A) store and output the data bits din_1~din_8 (step 62). According to the output of the registers 300 (or 300A), whether or not to enter the special mode is determined (step 63). The step 63 comprises the following sub-steps. First, a logic circuit 302 (or 302A) is provided to output a first logic state such as logic "1" when the data bits output from the registers are a predetermined value of 10000101(133), otherwise output a second logic state such as logic "0" (step 631). When the logic circuit 302 (or 302A) outputs the first logic state, entering the special mode (step 632).

Figure 7:
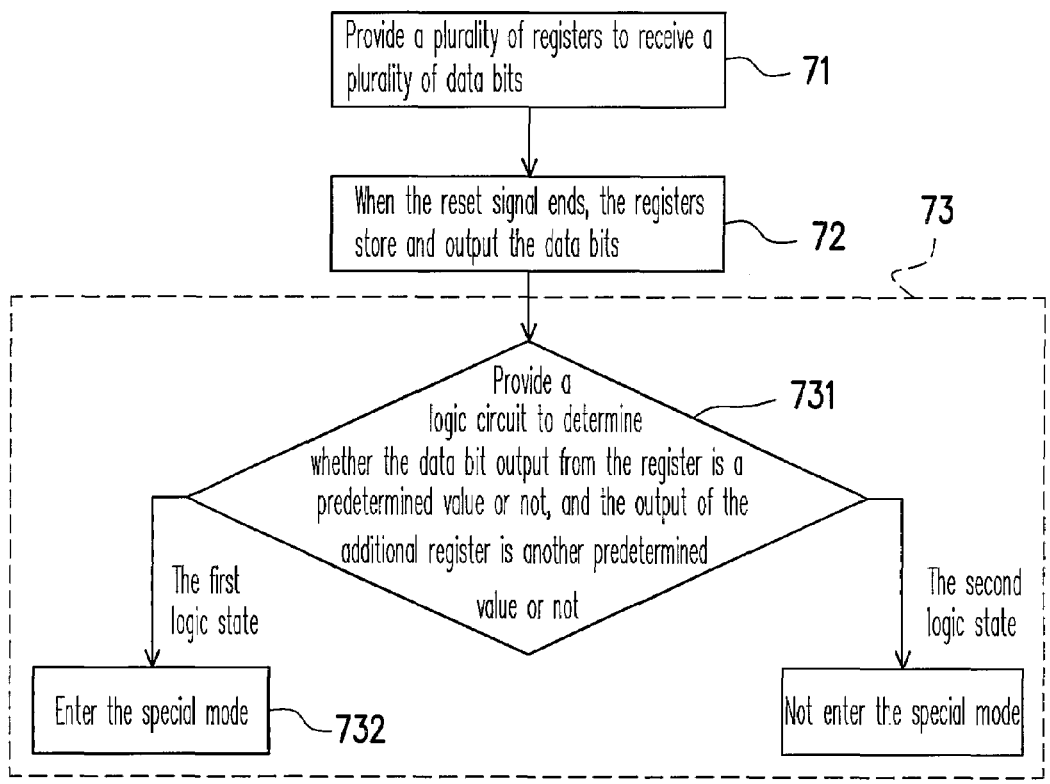
FIG. 7 is a flow chart of a method for entering the special mode in the IC according to an embodiment of the present invention.

The embodiments of FIGS. 5A and 5B are similar to those of FIGS. 3A and 3B and can also be classified into one method for entering the special mode in the IC, and the flow chart thereof is shown in FIG. 7. First, a plurality of registers 300 (or 300A) is provided to receive a plurality of data bits din_1~din_8 (step 71). When the reset signal resetb is enabled, the registers 300 (or 300A) store and output the data bits din_1~din_8 (step 72). According to the output of the registers 300 (or 300A), whether or not to enter the special mode is determined (step 73). The step 73 comprises the following sub-steps. First, a logic circuit 302 (or 302A) is provided to output a first logic state when the data bits output from the registers 300 (or 300A) are a predetermined value of 10000101(133) and the output of a set of additional registers 502 (or 502A) is a predetermined value of logic "1", otherwise output a second logic state (step 731). When the logic circuit 302 (or 302A) outputs the first logic state, enter the special mode (step 732).

Figure 8A:
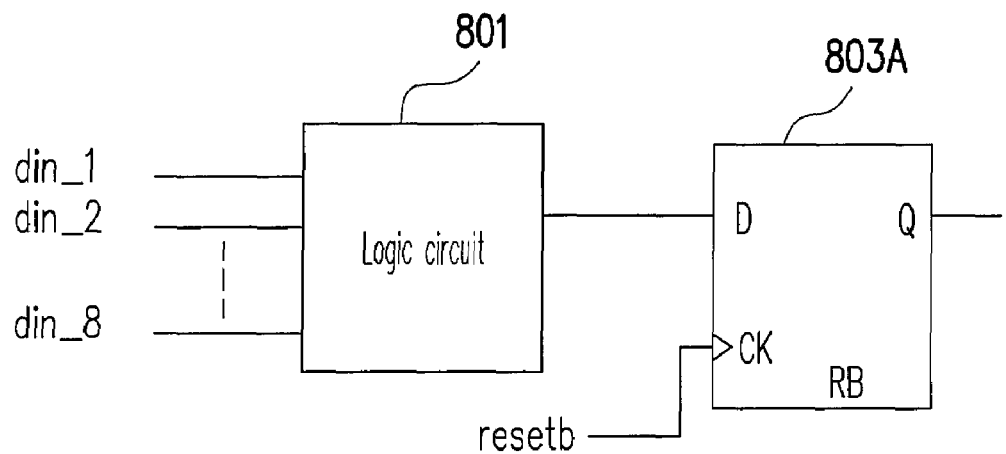
FIGS. 8A and 8B are the circuit diagrams of an apparatus for entering the special mode in the IC according to an embodiment of the present invention.

FIG. 8A is the circuit diagram of an apparatus for entering the special mode in the IC according to an embodiment of the present invention. This apparatus comprises a logic circuit 801 and a register 803A. Similarly, the register of the present invention is implemented by a D-type flip-flop. The logic input terminal of the logic circuit 801 receives the data bits din_1~din_8. The D input terminal of the D-type flip-flop 803A is coupled to the logic output terminal of the logic circuit 801. The clock input terminal of the D-type flip-flop 803A receives the reset signal resetb. Likewise, the reset signal resetb is used to reset the IC.

Herein, when the design of the din_1~din_8 of the logic circuit 801 is assumed to be a particular value such as 10000101(133), the output of the logic circuit 801 is logic "1", and when any other values are input into the logic circuit 801, the output is logic "0".

Likewise, the shop test of the IC before being sold is taken as an example. When it is intended to enter the special mode, the values of din_1~din_8 must be set to be a predetermined value, 10000101(133), then enable the reset signal resetb. Since the reset signal resetb is supplied to the clock input terminal of the D-type flip-flop 803A. When the reset signal resetb is enabled, the D-type flip-flop 803A is triggered to receive the logic "1", such that the D type flip-flop 803A outputs logic 1, thus entering the special mode.

Figure 8B:
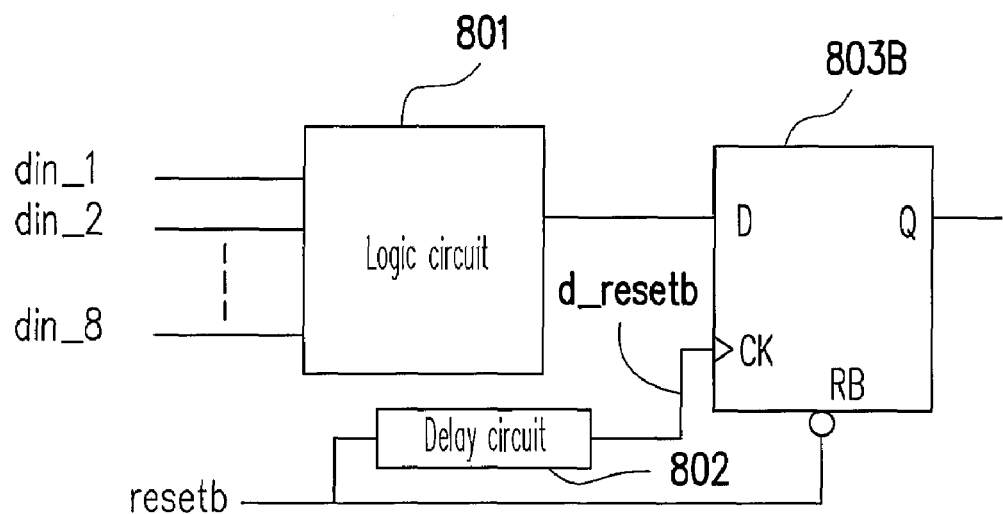

FIG. 8B is an extension of FIG. 8A, which illustrates the circuit diagram of an apparatus for entering the special mode in the IC according to an embodiment of the present invention. Referring to FIG. 8B, the circuit employs a register 803B with the reset function and an additional delay circuit 802. Different from FIG. 8A, the delay circuit 802 receives the reset signal resetb, and after delaying for a predetermined period of time, outputs a delayed reset signal d_resetb. The clock input terminal of the register 803B (i.e. the D-type flip-flop with the reset function in the present embodiment) receives the delayed reset signal d_resetb, and the reset input terminal (RB) of the register 803B is coupled to the reset signal resetb.

Thus, the register 803B can be reset when the IC is reset. After the delay circuit 802 delays the resetb for a sufficient period of time, the output of the logic circuit 801 can improve the stability of the circuit of the apparatus for entering the special mode.

Next, the client using the IC is taken as an example. When the client carelessly sets the value of din_1~din_8 to 10000101(133), since the reset signal resetb is not enabled, the D-type flip-flop 803A or 803B does not receive the logic "1". Thus, the client does not enter the special mode by mistake, and abnormal function of the IC will not occur.

Figure 9A:
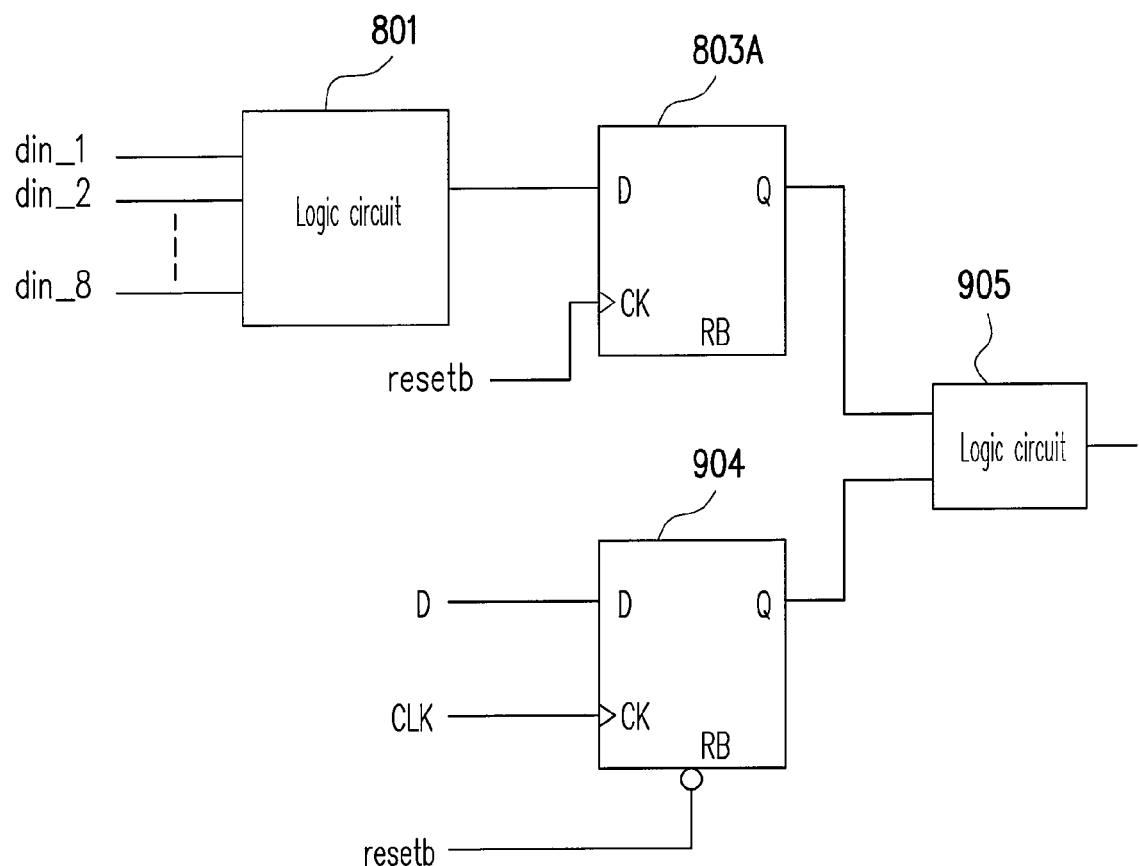
FIGS. 9A and 9B are the circuit diagrams of an apparatus for entering the special mode in the IC according to an embodiment of the present invention.

Likewise, an alternation can also be made to the embodiment of FIG. 8A within the spirit of the present invention, and the circuit thereof is shown in FIG. 9A. FIG. 9A is the circuit diagram of an apparatus for entering the special mode in the IC according to an embodiment of the present invention. In addition to the original logic circuit 801 and the register 803A in FIG. 8A, the apparatus further comprises a set of registers 904 and a logic circuit 905. With the input method of FIG. 8A, after the resetting is completed, a specified value such as logic "1" is set into the registers 904 by a program, such that the registers 904 output the specified value. The logic circuit 905, after receiving the logic "1" output from the register 803A and the logic "1" output from the registers 904, outputs the logic "1", thus entering the special mode. In this manner, the client can be effectively prevented from carelessly entering the special mode.

Figure 9B:
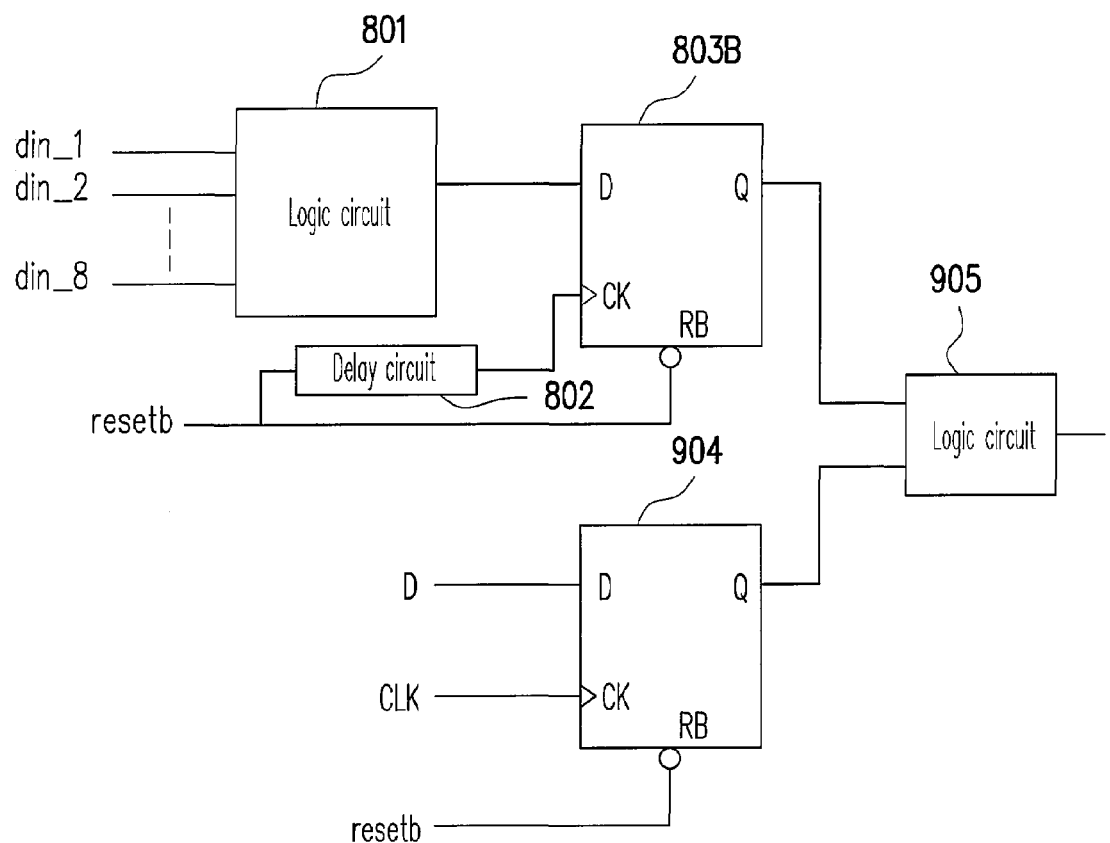

As the above alternation, the embodiment of FIG. 8B can also be changed to be that of FIG. 9B. FIG. 9B is the circuit diagram of an apparatus for entering the special mode in the IC according to an embodiment of the present invention. In addition to the original logic circuit 801, the delay circuit 802, and the register 803B as shown in FIG. 8B, the apparatus further comprises a set of registers 904 and a logic circuit 905. With the input method of FIG. 8B, after the reset is completed, a specified value such as logic "1" is set into the registers 904 by a program, such that the registers 904 output the specified value. The logic circuit 905, after receiving the logic "1" output from the register 803B and the logic "1" output from the registers 904, outputs the logic "1", thus entering the special mode. In this manner, the client can be effectively prevented from carelessly entering the special mode.

Figure 10:
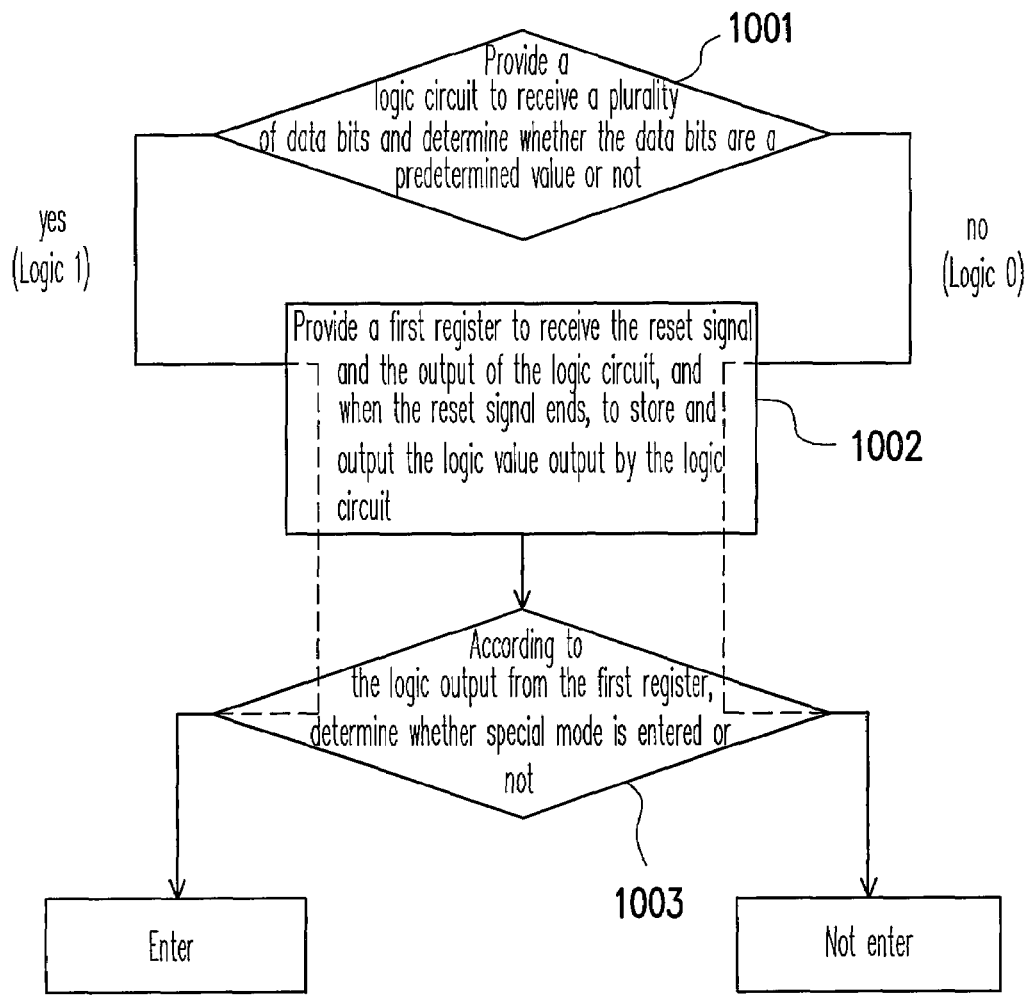
FIG. 10 is a flow chart of a method for entering the special mode in the IC according to an embodiment of the present invention.

The above embodiments of FIG. 8A (or FIG. 8B) can be classified into one method for entering the special mode in the IC, and the flow chart thereof is shown in FIG. 10. First, a logic circuit 801 is provided to receive a plurality of data bits din_1~din_8. When the data bits din_1~din_8 are a predetermined value, the logic circuit 801 outputs a first logic value (logic "1"), otherwise output a second logic value (logic "0") (step 1001). The first register 803A (or 803B) is provided to receive the reset signal resetb (or d_resetb) and the output of the logic circuit 801. When the reset signal resetb (or d_resetb) is enabled, the first register 803A (or 803B) stores and outputs the logic value output by the logic circuit 801 (step 1002). According to the logic value output from the first register 803A (or 803B), whether or not to enter the special mode is determined (step 1003). When the logic value output from the first register 803A (803B) is a predetermined value such as the above-mentioned logic "1", enter the special mode.

Figure 11:
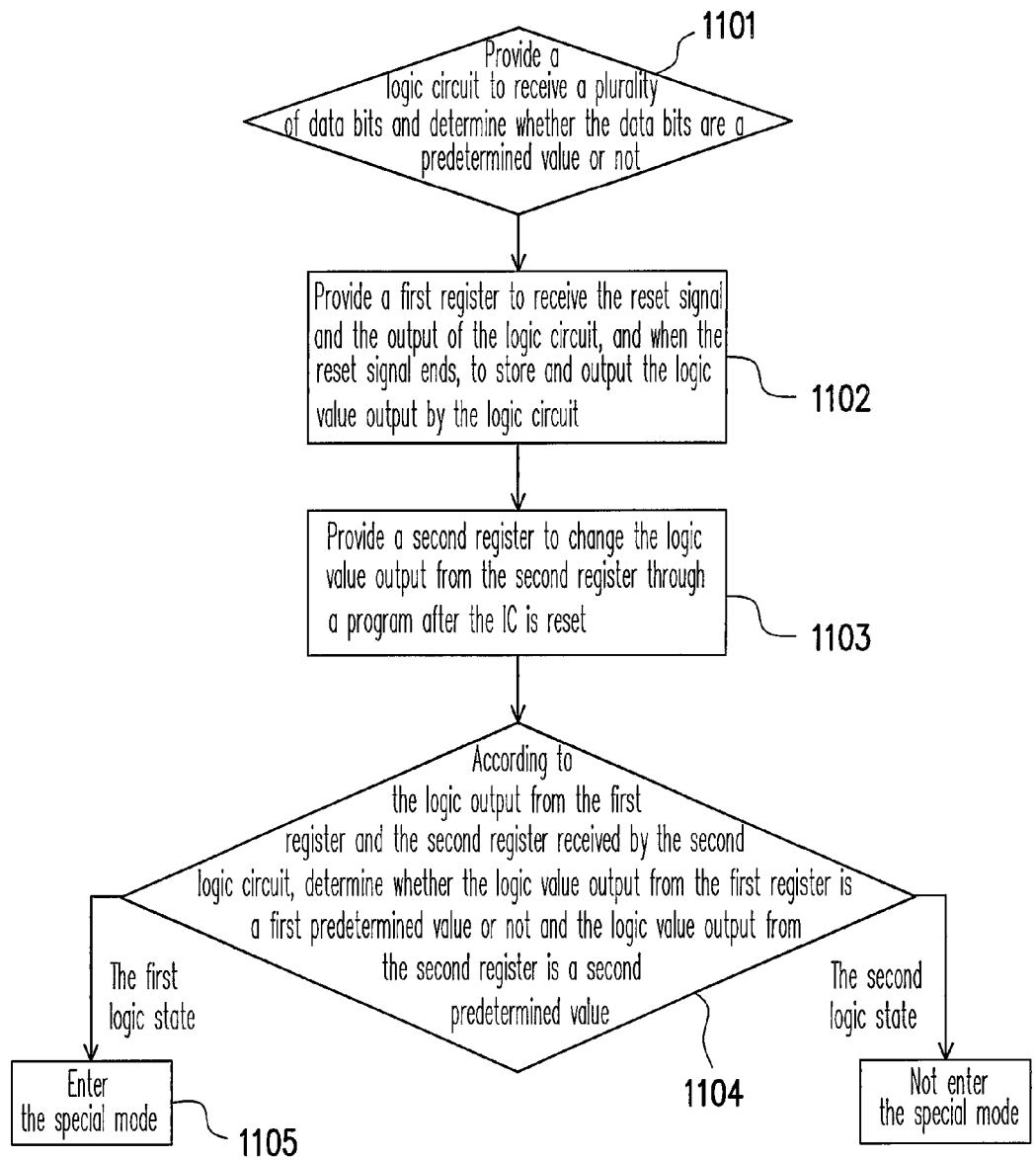
FIG. 11 is a flow chart of a method for entering the special mode in the IC according to an embodiment of the present invention.

The embodiments of FIGS. 9A and 9B are similar to those of FIGS. 8A and 8B and can also be classified into one method for entering the special mode in the IC, and the flow chart thereof is shown in FIG. 11. First, a logic circuit 801 is provided to receive a plurality of data bits din_1~din_8. When the data bits din_1~din_8 are a predetermined value, the logic circuit 801 outputs a first logic value (logic "1"), otherwise outputs a second logic value (logic "0") (step 1101). The first register 803A (or 803B) is provided to receive the reset signal resetb (or d_resetb) and the output of the logic circuit 801. When the reset signal resetb (or d_resetb) is enabled, the first register 803A (or 803B) stores and outputs the logic value output by the logic circuit 801 (step 1102). A second register 904 is provided to change the logic value output from the second register 904 through a program after the IC is reset (step 1103). A second logic circuit 905 is provided to receive the logic value output from the first register 803A (or 803B) and the logic value output from the second register 904. When the logic value output from the first register 803A (or 803B) is a first predetermined value (such as logic "1") and the logic value output from the second register 904 is a second predetermined value (such as logic "1"), the second logic circuit 905 outputs a first logic state, otherwise outputs a second logic state (step 1104). When the second logic circuit 905 outputs the first logic state, enter the special mode (step 1105).

If the above IC is, for example, used in a liquid crystal display module, the liquid crystal display module is provided with the method for entering the special mode. However, the method applied to the liquid crystal display module is not intended to limit the method applied to the IC in the liquid crystal display module. The apparatus and method of the present invention can be applied to not only the IC, but also the logic circuit not in the form of IC, such as the circuit directly fabricated on the circuit board or the circuit fabricated on the glass substrate of liquid crystal module. And the operation method and operation principle are the same as the applications of the above IC, and the details will not be described herein again.

In view of the above, in the present invention, during the resetting of the IC or the liquid crystal display module, the original data line is set to be a particular data value, thus accomplishing entering the special mode without using additional pins of the IC or the liquid crystal display module, and also preventing the clients from carelessly entering the special mode which may cause an unsuspected function or some abnormal functions of the IC or the liquid crystal display module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for entering a special mode in the integrated circuit (IC), the IC receiving a plurality of data bits and a reset signal, wherein the reset signal is used to reset the IC, the apparatus comprising:

a plurality of registers, each of the registers comprising an input terminal, an output terminal, and a clock input terminal, wherein the input terminal receives one of the data bits, the clock input terminal receives the reset signal, and the output terminal outputs one of the data bits received by the input terminal when the reset signal is enabled; and a logic circuit, comprising a logic output terminal and a plurality of logic input terminals being coupled to the registers, for receiving the data bits output from the registers, and when the logic input terminals receive a preset value, outputting a preset logic value to enter the special mode.

2. The apparatus for entering the special mode in the IC as claimed in claim 1, wherein the registers comprise a plurality of D-type flip-flops, each of the D-type flip-flops comprises a D input terminal coupled to the input terminal of each of the registers for receiving the data bits, a D output terminal coupled to the output terminal of each of the registers, and a clock input terminal coupled to the clock input terminal of each of the registers for receiving the reset signal.

3. The apparatus for entering the special mode in the IC as claimed in claim 1, further comprising:

an additional register, comprising a register clock input terminal for receiving a clock signal, a register input terminal for receiving an input signal, and a register output terminal being coupled to one of the logic input terminals.

4. The apparatus for entering the special mode in the IC as claimed in claim 3, wherein the additional register is a D-type flip-flop comprising a D clock input terminal, a D input terminal, a D output terminal, and a D reset terminal, wherein the register clock input terminal is the D clock input terminal, the register input terminal is the D input terminal, the register output terminal is the D output terminal, and the reset terminal is the D reset terminal.

5. An apparatus for entering a special mode in the IC, the IC receiving a plurality of data bits and a reset signal, wherein the reset signal is used to reset the IC, the apparatus comprising:

a first logic circuit, comprising a first logic output terminal and a plurality of the first logic input terminals for receiving the data bits, when the data bits received by the first logic input terminals are a predetermined value, outputting a predetermined logic value; and a first register, comprising a first clock input terminal for receiving the reset signal, a first register input terminal being coupled to the first logic output terminal, and a first register output terminal, when the reset signal is enabled, the first register storing and outputting the logic value output by the first logic output terminal, wherein whether or not to enter the special mode is determined according to the logic value output by the first logic output terminal.

6. The apparatus for entering the special mode in the IC as claimed in claim 5, wherein the first register is a D-type flip-flop comprising a D reset terminal, a D input terminal, a D output terminal, and a D clock input terminal, wherein the D input terminal is the first register input terminal, the D clock input terminal is the first clock input terminal, the D output terminal is the first register output terminal, and the D reset terminal is the first reset terminal.

7. The apparatus for entering the special mode in the IC as claimed in claim 6, further comprising:

a second register, comprising a second clock input terminal for receiving a clock signal, a second register input terminal for receiving an input data, a second register output terminal, and a second reset terminal for receiving the reset signal; and a second logic circuit, comprising a second logic output terminal and a plurality of the second logic input terminals being respectively coupled to the second register output terminal and the first register output terminal, after performing a logic operation on the output logic of the second register output terminal and the first register output terminal, outputting a logic decision value, and when the logic decision value is a logic predetermined value, entering the special mode.

8. The apparatus for entering the special mode in the IC as claimed in claim 7, wherein the second register is a D-type flip-flop comprising a D reset terminal, a D input terminal, a D output terminal, and a D clock input terminal, wherein the D input terminal is the second register input terminal, the D clock input terminal is the second clock input terminal, the D output terminal is the second register output terminal, and the D reset terminal is the second reset terminal.

9. An apparatus for entering a special mode in the IC, the IC receiving a plurality of data bits and a reset signal, wherein the reset signal is used to reset the IC, the apparatus comprising:

a first logic circuit, comprising a first logic output terminal and a plurality of first logic input terminals for receiving the data bits, when the data bits received by the first logic input terminals are a predetermined value, outputting a predetermined logic value;

a delay circuit, for receiving the reset signal and delaying the reset signal for a predetermined period of time as a delayed reset signal; and a first register, comprising a first clock input terminal for receiving the delayed reset signal, a first register input terminal being coupled to the first logic output terminal, and a first register output terminal, when the delayed reset signal is enabled, the first register storing and outputting the logic value output by the first logic output terminal, wherein whether or not to enter the special mode is determined according to the logic value output by the first logic output terminal.

10. The apparatus for entering the special mode in the IC as claimed in claim 9, wherein the first register is a D-type flip-flop comprising a D reset terminal, a D input terminal, a D output terminal, and a D clock input terminal, wherein the D input terminal is the first register input terminal, the D clock input terminal is the first clock input terminal, the D output terminal is the first register output terminal, the D reset terminal is the delay circuit output terminal, and the delay circuit input terminal is the first reset terminal.

11. The apparatus for entering the special mode in the IC as claimed in claim 10, further comprising:

a second register, comprising a second clock input terminal for receiving a clock signal, a second register input terminal for receiving an input data, a second register output terminal, and a second reset terminal for receiving the reset signal; and a second logic circuit, comprising a second logic output terminal and a plurality of the second logic input terminals being respectively coupled to the second register output terminal and the first register output terminal, after performing a logic operation on the output logic of the second register output terminal and the first register output terminal, outputting a logic decision value, and when the logic decision value is a logic predetermined value, entering the special mode.

12. The apparatus for entering the special mode in the IC as claimed in claim 11, wherein the second register is a D-type flip-flop comprising a D reset terminal, a D input terminal, a D output terminal, and a D clock input terminal, wherein the D input terminal is the second register input terminal, the D clock input terminal is the second clock input terminal, the D output terminal is the second register output terminal, and the D reset terminal is the second reset terminal.

13. A method for entering a special mode in the IC, wherein a reset signal is used to reset the IC, the method comprising:

providing a plurality of registers to receive a plurality of data bits;

receiving the reset signal to be a clock input signal of the registers, when the reset signal is enabled, the registers storing and outputting the data bits; and determining whether or not to enter the special mode according to the output of the registers.

14. The method for entering the special mode in the IC as claimed in claim 13, wherein whether or not to enter the special mode is determined according to the output of the registers, comprising:

providing a logic circuit to output a first logic state when the data bits output from the registers are a predetermined value, otherwise output a second logic state; and when the logic circuit outputs the first logic state, entering the special mode.

15. The method for entering the special mode in the IC as claimed in claim 13, wherein whether or not to enter the special mode is determined according to the output of the registers, comprising:

providing a logic circuit to output a first logic state when the data bits output from the registers are a first predetermined value and the output of an additional register is a second predetermined value, otherwise output a second logic state; and when the logic circuit outputs the first logic state, entering the special mode.

16. A method for entering a special mode in the IC, wherein a reset signal is used to reset the IC, the method comprising:

providing a logic circuit to receive a plurality of data bits aid output a first logic value when the data bits are a predetermined value, otherwise output a second logic value;

providing a first register comprising a register clock input terminal for receiving the reset signal and a register input terminal for receiving the output of the logic circuit and storing and outputting the logic value output by the logic circuit when the reset signal is enabled; and determining whether or not to enter the special mode according to the logic value output from the first register.

17. The method for entering the special mode in the IC as claimed in claim 16, wherein whether or not to enter the special mode is determined according to the logic value output from the first register, comprising:

entering the special mode when the logic value output from the first register is a predetermined logic value.

18. The method for entering the special mode in the IC as claimed in claim 16, wherein whether or not to enter the special mode is determined according to the logic value output from the first register, comprising:

providing a second register to change the output logic value thereof through a program after the IC is reset;

providing a second logic circuit to receive the logic value output from the first register and the logic value output by the second register, and to output a first logic state when the logic value output from the first register is a first predetermined value and the logic value output by the second register is a second predetermined value, otherwise output a second logic state; and entering the special mode when the second logic circuit outputs the first logic state.

19. An apparatus for entering a special mode in the IC, the IC receiving a plurality of data bits and a reset signal, wherein the reset signal is used to reset the IC, the apparatus comprising:

a delay circuit, for receiving the reset signal and delaying the reset signal for a predetermined period of time as a delayed reset signal; and a plurality of registers, each of the registers comprising a register input terminal for receiving one of the data bits, a register reset terminal for receiving the reset signal, a register clock input terminal for receiving the delayed reset signal, and a register output terminal, when the reset signal is enabled, all the registers being reset, and after being delayed for a certain period of time, the data bits being output; and a logic circuit, comprising a logic output terminal and a plurality of logic input terminals being coupled to the registers for receiving the plurality of data bits output from the registers, when the logic input terminals receive a predetermined value, outputting a predetermined logic value to enter the special mode.

20. The apparatus for entering the special mode in the IC as claimed in claim 19, further comprising:

an additional register, comprising a register clock input terminal for receiving a clock signal, an register input terminal for receiving an input signal, and an register output terminal being coupled to one of the logic input terminals.

21. The apparatus for entering the special mode in the IC as claimed in claim 20, wherein the additional register is a D-type flip-flop comprising a D clock input terminal, a D input terminal, a D output terminal, and a D reset terminal, wherein the register clock input terminal is the D clock input terminal, the register input terminal is the D input terminal, the register output terminal is the D output terminal, and the reset terminal is the D reset terminal.

* * * * *